United States Patent [19]
Sato et al.

[11] Patent Number: 5,591,494
[45] Date of Patent: *Jan. 7, 1997

[54] DEPOSITION OF SILICON NITRIDES BY PLASMA-ENHANCED CHEMICAL VAPOR DEPOSITION

[75] Inventors: Tatsuya Sato; Atsushi Tabata, both of Narita; Naoaki Kobayashi, Sakura, all of Japan

[73] Assignee: Applied Materials, Inc., Santa Clara, Calif.

[*] Notice: The term of this patent shall not extend beyond the expiration date of Pat. No. 5,508,067.

[21] Appl. No.: 600,084

[22] Filed: Feb. 12, 1996

Related U.S. Application Data

[63] Continuation of Ser. No. 507,718, Jul. 26, 1995, Pat. No. 5,508,067, which is a continuation of Ser. No. 310,545, Sep. 22, 1994, abandoned.

[30] Foreign Application Priority Data

Sep. 24, 1993 [JP] Japan ..................... 5-238565

[51] Int. Cl.$^6$ .................................................. H05H 1/24
[52] U.S. Cl. ..................... 427/579; 427/255.2; 427/294; 427/585
[58] Field of Search ..................... 427/579, 294, 427/255.2, 585

[56] References Cited

U.S. PATENT DOCUMENTS

| | | | |
|---|---|---|---|
| 4,395,438 | 7/1983 | Chiang | 427/94 |
| 4,693,827 | 9/1987 | Mordorski | 210/614 |
| 4,699,825 | 10/1987 | Sakai et al. | 428/337 |
| 4,934,450 | 7/1990 | Sarin | 427/255.2 |
| 5,043,224 | 8/1991 | Jaccodine et al. | 428/446 |
| 5,508,067 | 4/1996 | Sato et al. | 427/579 |

FOREIGN PATENT DOCUMENTS

| | | | |
|---|---|---|---|
| 334791 | 9/1989 | European Pat. Off. | C23C 16/34 |
| 275264 | 1/1990 | Germany | C23C 319/302 |

OTHER PUBLICATIONS

Industrial Water Pollution Control W. Wesley Eckenfelder, Jr. McGraw–Hill Book Company (No Date Available).

*Primary Examiner*—Bernard Pianalto
*Attorney, Agent, or Firm*—Birgit E. Morris; Michael B. Einschlag

[57] ABSTRACT

A silicon nitride or silicon oxynitride film is deposited by plasma enhanced chemical vapor deposition from a precursor gas mixture of a silane, a nitrogen-containing organosilane and a nitrogen-containing gas at low temperatures of 300°–400° C. and pressure of 1–10 Torr. The silicon nitride films have low carbon content and low hydrogen content, low wet etch rates and they form conformal films over stepped topography.

8 Claims, 2 Drawing Sheets

DEPOSITION OF SILICON NITRIDES BY PLASMA-ENHANCED CHEMICAL VAPOR DEPOSITION

This is a continuation of application Ser. No. 08/507,718 filed Jul. 26, 1995, now U.S. Pat. No. 5,508,067, which is a continuation of Ser. No. 08/301,545 filed Sep. 22, 1994, abandoned.

BACKGROUND OF THE DISCLOSURE

This invention relates to the deposition of silicon nitride. More particularly, this invention relates to the deposition of silicon nitride from a plasma of an inorganic silane, an organosilane and a nitrogen-containing gaseous compound.

Silicon nitride films are dielectric films that have been used as insulating and passivating or protective films for integrated circuits. Such films include silicon nitride ($Si_3N_4$) and silicon oxynitride (SiON) films. Protective films can be formed by chemical vapor deposition (hereinafter CVD) at high temperatures of about 600°–700° C. by pyrolysis of silane for example. However, when metal contacts are made from aluminum, aluminum alloys or other low melting metal, processing temperatures after formation of the contacts are limited to about 450° C. to avoid damage to the metal contacts. Plasma processing is compatible with these low temperature requirements. Thus plasma enhanced chemical vapor deposition (PECVD) has also been tried for depositing protective silicon nitride films at low temperatures that will not adversely affect metal contacts or otherwise damage the integrated circuit. Also, when PECVD is used to deposit silicon nitride films for use as intermetal dielectrics, the conformally of the films over stepped topography is good. The usual starting material for silicon nitride deposition is silane ($SiH_4$) but organosilane starting materials, such as hexamethyldisilazane (HMDS), are also used.

One of the problems with low temperature deposition of silicon nitride films from silane is that large amounts of hydrogen are incorporated into the films as Si—H and N—H bonds. The presence of large amounts of hydrogen contributes undesirably to a high wet etch rate for these films, so that when a subsequent etch step is required, as for patterning the silicon nitride film, etch rates are up to 100 times faster than silicon nitride films made by high temperature processing. Thus silicon nitride films deposited by PECVD cannot be used as masking layers.

Silicon nitride and silicon oxynitride films deposited by PECVD from organosilanes do not contain large amounts of hydrogen, are, thus these films have lower wet etch rates. However, films from organosilanes do contain high amounts of carbon, and the conformality of these films with respect to deposition on stepped topography is poor. In addition, at low deposition temperatures, polymeric products also tend to form from organosilanes, which precludes their use as final protective films for integrated circuits.

Thus a method of forming silicon nitride and silicon oxynitride films at low temperature, but without formation of polymeric residues, to produce a film having a low wet etch rate, low carbon content and with good conformality over stepped topography would be highly desirable.

SUMMARY OF THE INVENTION

The present process is directed to forming silicon nitride and silicon oxynitride films deposited by low temperature PECVD from a precursor gas mixture comprising an inorganic silane, a nitrogen-containing organosilane and a nitrogen-containing gas. The gas precursor mixture is fed to a reaction chamber fitted with a source of RF power sufficient to ignite a plasma from the gases that will deposit silicon nitride and silicon oxynitride films having improved conformality and improved properties for use as dielectric films and protective films for integrated circuits.

DETAILED DESCRIPTION OF THE INVENTION

In accordance with the present process, silicon nitride and silicon oxynitride can be deposited by PECVD from a precursor gas mixture comprising an inorganic silane compound, a nitrogen-containing organosilane compound and a source of nitrogen gas.

Suitable inorganic silane compounds have the formula $$Si_nX_{2n+2}$$

wherein X is selected from the group consisting of hydrogen and chlorine and n is an integer from 1–3. Suitable compounds include silicon hydrides such as silane, ($SiH_4$), disilane, ($Si_2H_6$), trisilane ($Si_3H_8$) and the like, and halogen-substituted silanes such as dichlorosilane ($SiCl_2H_2$), tetrachlorosilane ($SiCl_4$) and the like. Mixtures of the inorganic silane compounds can also be employed.

Suitable nitrogen-containing organosilanes comprise compounds of the formula $$(R)_3SiNHSi(R)_3$$

wherein R at each occurrence is alkyl or hydrogen, with the proviso that at least one R is alkyl, and compounds of the formula $$(R)_3SiN(R)_2$$

wherein R at each occurrence has the meaning given above, or mixtures thereof. Preferably R is methyl but higher alkyl groups, e.g., of 1–3 carbon atoms and one or more hydrogen atoms, can also be substituted.

Suitable nitrogen-containing compounds are inorganic compounds and include ammonia ($NH_3$) and nitrogen ($N_2$) or oxygen-containing nitrogen compounds such as nitrous oxide ($N_2O$) and nitric oxide (NO). Mixtures of these compounds can also be used.

The precursor gas stream can also include inert carrier gases such as helium and argon, and excess nitrogen gas can also act as a carrier gas.

By using both an N-containing organosiilane and a nitrogen-containing gas, improved properties of the resulting silicon nitride film, such as good refractive index, are obtained. Step coverage was also improved, with no overhang of the compound formed over steps.

The silicon nitride or silicon oxynitride compounds deposited according to the invention are deposited in a suitable PECVD reactor, such as that described in FIG. 1, which will be further explained hereinbelow.

Figure 1:
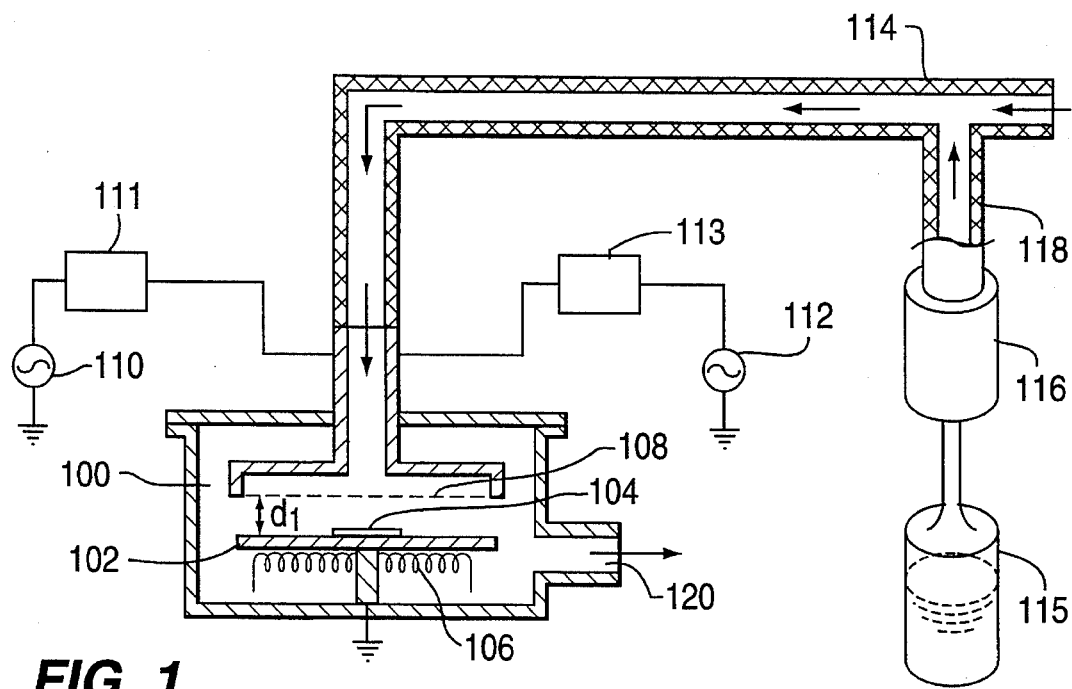
FIG. 1 is a cross sectional view of a plasma enhanced chemical vapor deposition apparatus in which the process of the invention can be carried out.

FIG. 1 is a cross sectional view of a suitable reactor for the deposition of silicon nitride films of the invention. The reaction chamber 100 comprises a grounded, temperature-controlled electrode substrate support 102 for a substrate 104 supported thereon. The temperature of the substrate support 102 is controlled by heating means 106. Parallel to the substrate and separated by a preselected distance d1, suitably about 0.5 to 2.5 cm, is a gas manifold plate 108. As shown, the gas manifold plate 108 is connected to a high frequency power source 110 (HF) through an impedance matching circuit 111, and to a low frequency power source 112 (LF) through impedance matching circuit 113. The precursor reaction gas mixture is passed into the gas manifold plate 108. A mixture comprising gases including an inorganic silane, a nitrogen-containing organosilane and a gaseous source of nitrogen such as nitrogen, ammonia and the like, are flowed into a pipe 114. Liquid compounds such as HMDS are passed from a container 115 through a liquid flow controller 116 and into another pipe 118 that connects to pipe 114 where the precursor compounds are mixed together. The liquid HMDS can be vaporized at temperatures over about 50° C., or a flow of a carrier gas can be passed through the liquid to carry a required amount of HMDS in the gas stream. The precursor gases are passed into the chamber 100 through the gas manifold plate 108. The chamber 100 is evacuated by means of an exhaust pump (not shown) through outlet 120.

When dual high and low frequency power sources are coupled into the deposition vacuum chamber 100, a plasma forms adjacent to the substrate 104 on which silicon nitride or silicon oxynitride is to be deposited. Suitably the gas flow rate ratio between the inorganic silane compound and the nitrogen-containing organosilane compound, defined as molar concentration of organosilane compound divided by the combined molar concentration of both the organosilane and the inorganic silane, is from 5–50%. The use of dual frequency power sources during deposition of the present silicon nitride films results in films having good compressive stress. Films made in accordance with the invention meet state-of-the-art requirements for compressive stress, e.g., about $2.5 \times 10^9$ dynes/cm$^2$, and preferably about $0.5 \times 10^9$ dynes/cm$^2$ or lower. A PECVD chamber having a single power source can also be used, but use of a single frequency power source may result in films having tensile stress.

The pressure in the PECVD chamber advantageously is maintained from about 1–10 Torr. The high frequency source can be from 200 kHz to 13.56 MHz and can provide power of from about 200–1000 Watts. The low frequency power source can be about 100–500 kHz for example, at a power of about 90 watts. The substrate temperature during deposition can be from about 300°–400° C.

The high frequency power source is used to supply energy for the dissociation of the precursor gases, and the lower frequency power source is used for ion bombardment to control stress in the growing film. The total power will be between 200–1000 Watts when a dual power source is employed for the present process, and suitably the high frequency power source is at a frequency of 13.56 MHz and the low frequency power source is at a frequency of about 400 kHz. The frequency and power can be varied depending on the silicon nitride film properties desired with respect to stress, wet etch rate and the like.

Silicon nitride was deposited in a chamber as in FIG. 1 from a precursor mixture of HMDS, silane, ammonia and nitrogen in a partial pressure ratio of 3:1:6:3 at a total flow rate of 1300 sccm. The pressure in the chamber was maintained at 5 Torr and the temperature of the substrate was maintained at 360°–400° C. during deposition by control of the heater 106. High frequency power was applied to the electrode at a power of 0.02 Watts/cm$^2$ and a HF to LF power ratio of 3:1 to generate a plasma from the precursor gases.

Figure 2A:
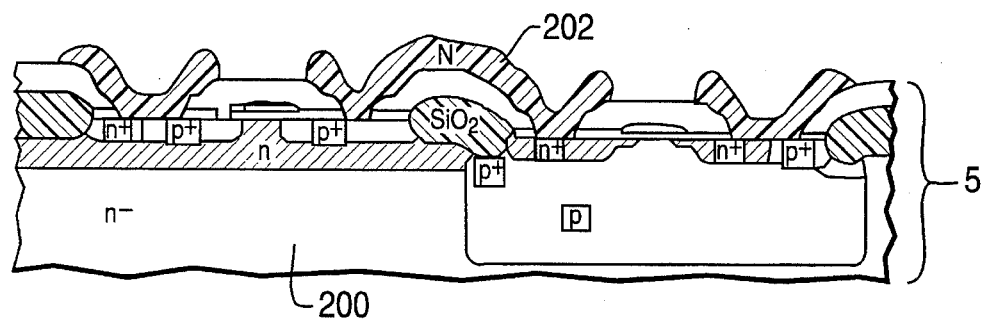
FIG. 2A is a cross sectional view of a partially formed integrated circuit of the prior art.

FIG. 2A is a cross sectional view of a patterned substrate 200, such as a partially formed integrated circuit having a patterned layer of aluminum 202 thereon, upon which a silicon nitride protective film is to be deposited.

Figure 2B:
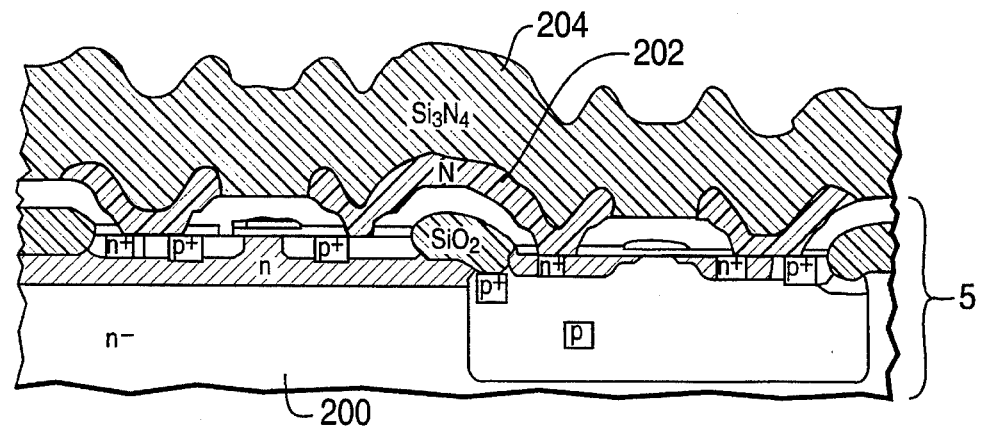
FIG. 2B is a cross sectional view of a partially formed integrated circuit on which a layer of silicon nitride has been deposited in accordance with the invention.

FIG. 2B is a cross sectional view of a patterned substrate 200 having a silicon nitride film 204 deposited over the aluminum layer 202 in accordance with the method of the invention.

The deposited silicon nitride film had an index of refraction of at least 2.0, and compressive film stress of $-2 \times 10^9$ dynes/cm$^2$ measured by laser interferometry. This shows that the silicon nitride film obtained had a film quality equivalent to silicon nitride deposited by pyrolysis.

The wet etch rate of the deposited silicon nitride film in buffered HF (HF:NH$_4$F 6:1) was 5 angstroms/minute or less. The conformality was equivalent to a PECVD silicon nitride film deposited using silane as the sole silicon starting material. The film was immersed in aqua regia and no pinholes were found. The carbon content was 3% by weight or less as determined by infrared absorption spectroscopy, indicating that few C—H bonds were present. Thus the silicon nitride film obtained had excellent properties for a protective layer.

Figure 3:
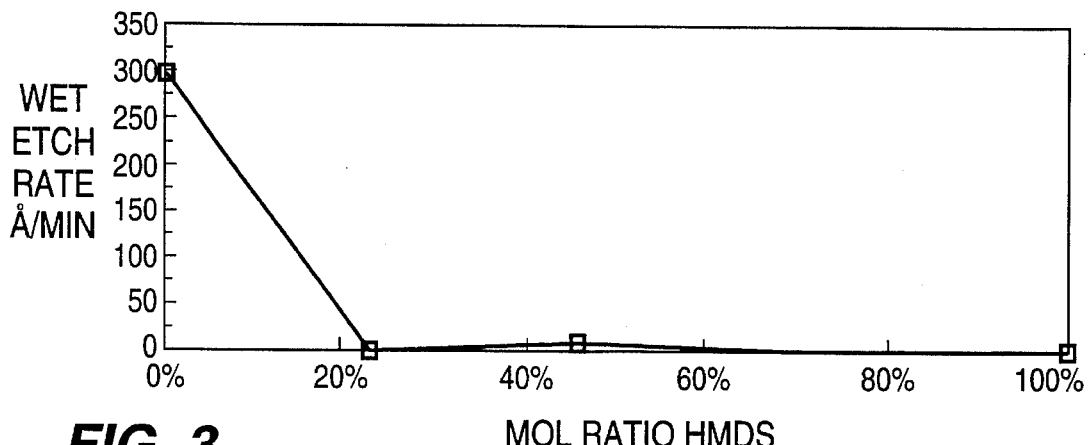
FIG. 3 is a graph of wet etch rate versus the ratio of silicon and hexamethyldisilazane in a precursor gas mixture.

FIG. 3 is a graph showing variation of wet etch rate using 6:1 buffered HF at increasing mol ratios of HMDS at the same total flow rates. It is apparent that the etch rate decreases rapidly as the amount of HMDS increases up to about 20% when the wet etch rate stabilizes at about 5 angstroms per minute. The variation of etch rate versus HMDS mol ratio also permits tailoring of the etch rate by proper choice of the precursor gas flow ratios.

Figure 4:
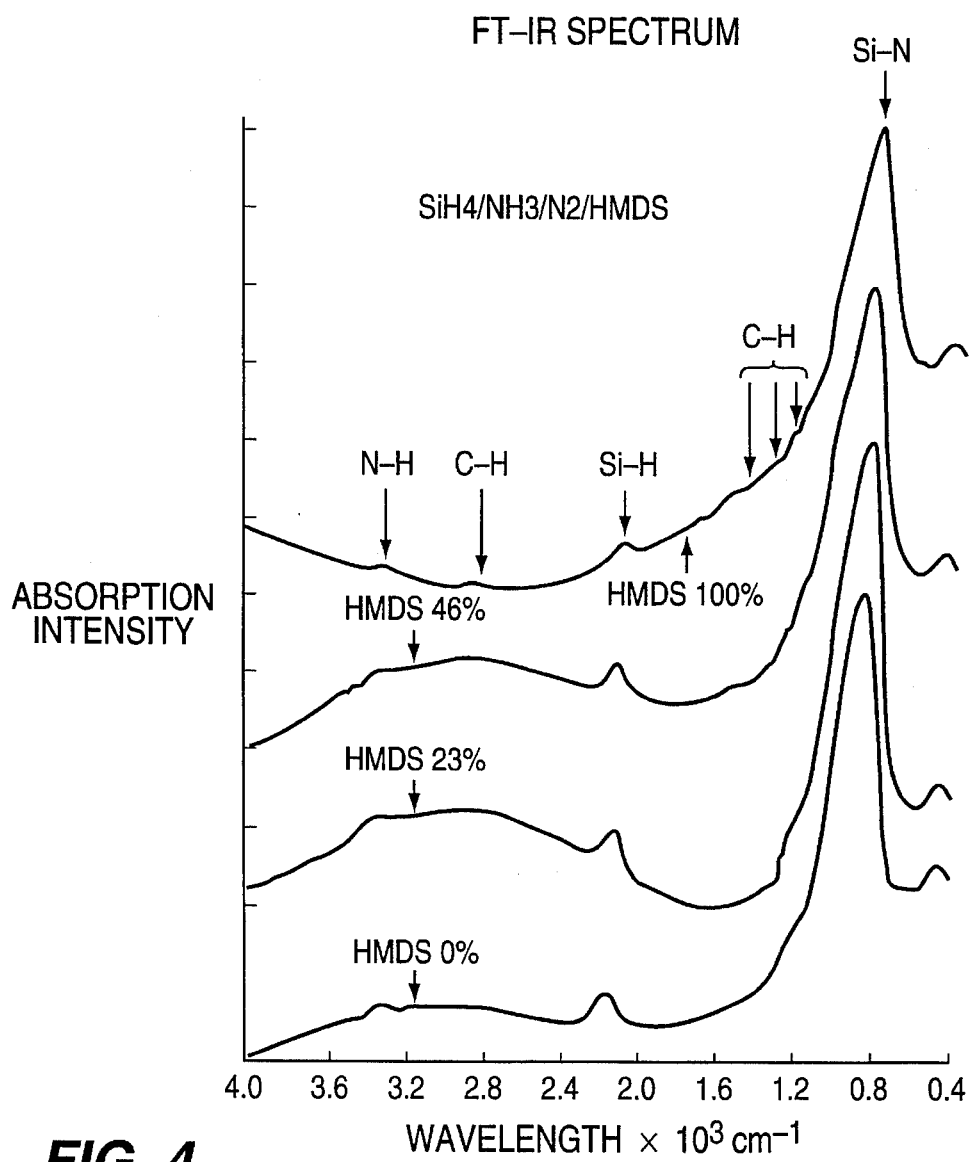
FIG. 4 is a graph of absorption intensity versus wavelength for various mixtures of silane and hexamethyldisilazane.

Infrared absorption spectroscopy was used to measure the changes in carbon content of silicon nitride films as the amount of HMDS used in the precursor gas mixture increases. FIG. 4 is a graph of absorption intensity versus wavelength at varying HMDS content in the precursor gas. It is apparent that as the HMDS content of the precursor gas increases, the carbon content and the number of C—H bonds in the silicon nitride film also increase.

Similar results are obtained when an oxygen-containing nitrogen precursor gas is employed, such as NO or N$_2$O, to form a silicon oxynitride compound.

Scanning electron microscopy was used to observe the conformality of the silicon nitride films. As the flow rate ratio was increased, conformality decreased. However, no marked deterioration of conformality was noted up to a flow rate ratio of about 50%.

Although the PECVD chamber of FIG. 1 was employed to prepare the above examples, the present invention is not limited to a parallel plate PECVD chamber, nor to the use of a dual frequency source reactor. The suggested deposition parameters of pressure, substrate temperature, gas flow rates, power, electrode distance and the like may be varied depending on the apparatus used for deposition. Alternatively, a chamber having a remotely generated plasma source, such as a helical resonator or a coil discharge type reactor, can also be employed.

The above details are given by way of example only, and the invention is not to be limited to the details given above. Various changes in equipment and reaction conditions and ratio of gases can be made as will be known to one skilled in the art. Thus the present invention is only to be limited by the scope of the appended claims.

We claim:

1. A process for depositing a silicon nitride film by plasma enhanced chemical vapor deposition comprising supplying a precursor gas mixture comprising an inorganic silane, a nitrogen-containing organosilane and a nitrogen-containing gas to a vacuum chamber, generating a plasma in the chamber from said precursor gases, and depositing a silicon nitride compound on a substrate in said chamber.

2. A process according to claim 1 wherein said inorganic silane has the formula $$Si_nX_{2n+2}$$

wherein X is selected from the group consisting of hydrogen and chlorine and n is an integer from 1–3.

3. A process according to claim 2 wherein said inorganic silane is silicon tetrahydride.

4. A process according to claim 1 wherein said nitrogen-containing organosilane has the formula $$(R)_3-Si-NH-Si-(R)_3$$

wherein R at each occurrence independently is alkyl or hydrogen with the proviso that at least one R is alkyl.

5. A process according to claim 4 wherein said nitrogen-containing organosilane is hexamethyldisilazane.

6. A process according to claim 1 wherein said nitrogen-containing organosilane has the formula $$(R)_3-SiN-(R)_2$$

wherein R at each occurrence independently is alkyl or hydrogen with the proviso that at least one R is alkyl.

7. A process according to claim 1 wherein the gas flow rate ratio or organosilane and combined molar concentration of organosilane and inorganic silane is about 5–50%.

8. A process according to claim 1 wherein said nitrogen-containing gas is a mixture of nitrogen and ammonia.

* * * * *